United States Patent
Ino et al.

(10) Patent No.: US 7,629,243 B2
(45) Date of Patent: Dec. 8, 2009

(54) METHOD FOR MANUFACTURING SEMICONDUCTOR DEVICE

(75) Inventors: Tsunehiro Ino, Fujisawa (JP); Akio Kaneko, Kawasaki (JP); Nobutoshi Aoki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 41 days.

(21) Appl. No.: 11/487,994

(22) Filed: Jul. 18, 2006

(65) Prior Publication Data

US 2007/0020901 A1    Jan. 25, 2007

(30) Foreign Application Priority Data

Jul. 19, 2005    (JP) ............... 2005-208915

(51) Int. Cl.
*H01L 21/4763* (2006.01)
(52) U.S. Cl. .................. 438/591; 438/216; 438/287; 438/537; 257/E21.625; 257/E21.639
(58) Field of Classification Search .......... 438/285, 438/527, 529, 532, 537, 199, 151, 216, 287, 438/531, 585, 591, FOR. 177, FOR. 202, 438/FOR. 395; 257/21.134, E21.135, E21.134, 257/E21.625, E21.639
See application file for complete search history.

(56) References Cited

U.S. PATENT DOCUMENTS 5,403,458 A * 4/1995 Hartig et al. ........... 204/192.15
6,667,525 B2 * 12/2003 Rhee et al. .................. 257/407
2004/0129988 A1 * 7/2004 Rotondaro et al. .......... 257/411
2004/0235280 A1 * 11/2004 Keys et al. .................. 438/528
2005/0181585 A1    8/2005 Yamauchi et al.

(Continued)

FOREIGN PATENT DOCUMENTS

JP    2002-299282    10/2002

(Continued)

OTHER PUBLICATIONS

Seiple et al., "Evolution of atomic-scale roughening on Si(001)–(2×1) surfaces resulting from high temperature oxidation," J. Vac. Sc. Technol. A (May/Jun. 1995), 13:772-776.

(Continued)

*Primary Examiner*—Matthew Smith
*Assistant Examiner*—Quovaunda Jefferson
(74) *Attorney, Agent, or Firm*—Finnegan, Henderson, Farabow, Garrett & Dunner, L.L.P.

(57) ABSTRACT

A method for manufacturing a semiconductor device is provided, which includes forming a gate insulating film on a semiconductor substrate, forming a first layer on the gate insulating film, the first layer containing a first p-type impurity and, an amorphous or polycrystalline formed of $Si_{1-x}Ge_x$ ($0 \leq x < 0.25$), subjecting the first layer to a first heat treatment wherein the first layer is heated for 1 msec or less at a temperature higher than 1100° C., forming a second layer on the first layer, the second layer containing a second p-type impurity and formed of amorphous silicon or polycrystalline silicon, the second p-type impurity having a smaller covalent bond radius than that of the first p-type impurity, and subjecting the second layer to a second heat treatment to heat the second layer at a temperature ranging from 800° C. to 1100° C.

10 Claims, 2 Drawing Sheets

U.S. PATENT DOCUMENTS

2006/0102968 A1* 5/2006 Bojarczuk et al. ........... 257/392

FOREIGN PATENT DOCUMENTS

| JP | 2004-119513 | 4/2004 |
| JP | 2004-214673 | 7/2004 |
| JP | 2005-136382 | 5/2005 |
| WO | WO 2004/086508 A1 | 10/2004 |

OTHER PUBLICATIONS

White, C. W. et al., "Supersaturated Substitutional Alloys Formed by Ion Implantation and Pulsed Laser Annealing of Group-III and Group-V Dopants in Silicon," J. Appl. Phys., vol. 51, No. 1, pp. 738-749, (Jan. 1980).

Notice of Reasons for Rejection mailed Jul. 22, 2008, from the Japanese Patent Office in counterpart Japanese Application No. 2005-208915.

Notice of Reasons for Rejection mailed Mar. 10, 2009, from the Japanese Patent Office in counterpart Japanese Application No. 2005-208915, and English language translation thereof.

Final Notice of Rejection mailed Sep. 8, 2009, in corresponding Japanese patent application No. 2005-208915, and English-language translation of same.

* cited by examiner

METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2005-208915, filed Jul. 19, 2005, the entire contents of which are incorporated herein by reference.

BACKGROUND OF THE INVENTION

1. Field of the Invention

This invention relates to a method for manufacturing a semiconductor device.

2. Description of the Related Art

Silicon oxide film ($SiO_2$ film) is a gate insulating film which is most universally employed in a semiconductor circuit. Due to the recent trend to further increase the density of semiconductor circuit, the thickness of $SiO_2$ film is required to be decreased. Additionally, since the intensity of electric current leaking the $SiO_2$ insulating film tends to increase, it is getting increasingly difficult to design the transistor or capacitor. The relative dielectric constant of the insulating film may be increased by the addition of an element such as Hf, N or Al to the $SiO_2$ film. Therefore, it is now tried to utilize these elements so as to weaken the electric field strength to be imposed on the insulating film to minimize the leak current even if the $SiO_2$ equivalent film thickness is thin.

Under some circumstances, a p-type impurity in the (poly-Si) gate electrode may diffuse into the gate insulating film. As a result, the gate voltage Vfb (flat band voltage) shifts from the inherent value.

For example, doping poly-Si gate electrode with a p-type dopant such as boron is used in a process which is considered mainly used currently. Through this doping, it is possible to create a transistor having a predetermined work function. It is also proposed to dope the poly-Si gate electrode with indium addition to boron. (JP-A 2004-214673(KOKAI))

However, in that proposal, the state of dopant atom such as indium is not regulated. Due to the presence of indium, the p-type dopant may be prevented from passing through a silicon layer or an SiGe layer. Under the heat treatment conditions to be employed in the ordinary LSI process for activating the p-type dopant, it would be impossible to electrically activate the indium existing in the silicon layer. Therefore, because of the state of dopant atom such as indium, it is impossible to prevent the generation of depletion layer having a thickness nearly corresponding to the layer containing indium. Thus, the thickness of effective gate insulating film would be increased by a thickness corresponding to the layer containing indium.

Further, if a substance having a high dielectricity is employed as a gate insulating film, the thickness of the depletion layer locating on the gate insulating film side of gate electrode would be increased by about 0.3 to 0.5 nm as compared with the $SiO_2$ film. As a result, the merit of the high dielectricity would not be wasted.

BRIEF SUMMARY OF THE INVENTION

A method for manufacturing a semiconductor device according to one aspect of the present invention comprises forming a gate insulating film on a semiconductor substrate; forming a first layer on the gate insulating film, the first layer containing a first p-type impurity and, an amorphous or polycrystalline formed of $Si_{1-x}Ge_x$ ($0 \leq x < 0.25$); subjecting the first layer to a first heat treatment wherein the first layer is heated for 1 msec or less at a temperature higher than 1100° C. or the first layer is irradiated with laser having an energy density of 1.5 J/cm² or more for 15 nsec or less to laser-anneal the first layer; forming a second layer on the first layer, the second layer containing a second p-type impurity and formed of amorphous silicon or polycrystalline silicon, the second p-type impurity having a smaller covalent bond radius than that of the first p-type impurity; and subjecting the second layer to a second heat treatment to heat the second layer at a temperature ranging from 800° C. to 1100° C.

A method for manufacturing a semiconductor device according to another aspect of the present invention comprises forming a gate insulating film on a semiconductor substrate; forming a first layer on the gate insulating film, the first layer containing a first p-type impurity and $Si_{1-x}Ge_x$ ($0.25 \leq x \leq 0.35$); and forming a second layer on the first layer, the second layer containing a second p-type impurity and, amorphous silicon or polycrystalline silicon, the second p-type impurity having a smaller covalent bond radius than that of the first p-type impurity.

A method for manufacturing a semiconductor device according to a further aspect of the present invention comprises forming a gate insulating film on a semiconductor substrate; forming a first layer on the gate insulating film, the first layer containing a first p-type impurity and, an amorphous or polycrystalline formed of $Si_{1-x}Ge_x$ ($0 \leq x < 0.25$); subjecting the first layer to a first heat treatment wherein the first layer is heated for 1 msec or less at a temperature higher than 1100° C. or the first layer is irradiated with laser having an energy density of 1.5 J/cm² or more for 15 nsec or less to laser-anneal the first layer; forming a metal boride layer on the first layer; and subjecting the metal boride layer to a second heat treatment to heat the metal boride layer at a temperature ranging from 800° C. to 1100° C.

DETAILED DESCRIPTION OF THE INVENTION

Next, various embodiments of the present invention will be explained with reference to drawings.

EXAMPLE 1

This example will be explained with reference to FIGS. 1 to 3.

Figure 1:
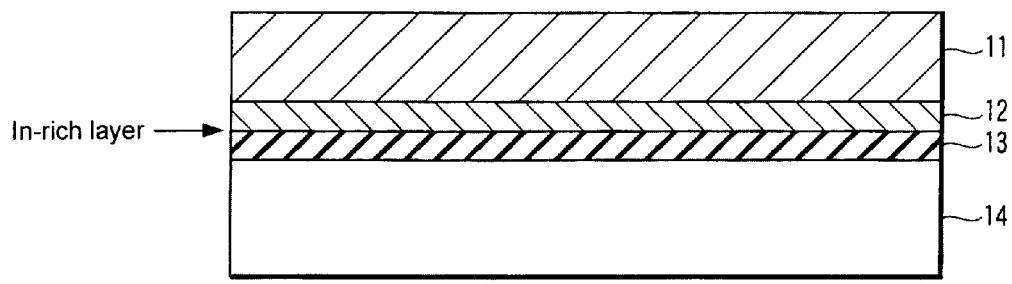
FIG. 1 is a cross-sectional view illustrating one step in the method of manufacturing a semiconductor device according to one embodiment of the present invention.

As shown in FIG. 1, a gate insulating film 13, a first layer 12 and a second layer 11 are successively deposited on a monocrystalline Si substrate 14. Incidentally, the monocrystalline Si substrate 14 is treated with dilute hydrofluoric acid to remove the natural oxide film formed thereon prior to the deposition of each of these layers.

As for the substrate 14, it is possible to employ an SiGe substrate, an SOI substrate, an SON substrate or a strained substrate.

The gate insulating film 13 should preferably be formed of a material which is higher in dielectric constant than that of $SiO_2$. For example, it is possible to employ HfSiON, ZrSiON, SiON, $LaAlO_3$, HfAlO, $SrTiO_3$, $SrZrO_3$, $SrHfO_3$, $BaZrO_3$, $BaHfO_3$, $CeO_x$ ($1.5 \leq x \leq 2.0$), $PrO_x$ ($1.5 \leq x \leq 2.0$) or $La_2O_3$.

For example, if the gate insulating film is to be formed by HfSiON, a film of $Hf_{0.6}Si_{0.4}O_2$ having a thickness of about 2 nm is formed at first by CVD method. As for the raw material of Hf, it can be selected from an alkoxide-based raw material and an amide-based Hf raw material. As for the alkoxide-based raw material, it is possible to employ, for example, $Hf(O\cdot t\text{-}C_4H_9)_4$. As for the amide-based Hf raw material, it is possible to employ, for example, $Hf[N(C_2H_5)_2]_4$ or $Hf[N(CH_3)_2]_4$. As for the raw material of Si, it is possible to employ an alkoxide-based raw material such, for example, as $Si(OC_2H_5)_4$ or $Si(O\cdot t\text{-}C_4H_9)_4$.

As it is possible to increase the dielectric constant of gate insulating film to make it possible to reduce the equivalent oxide thickness (EOT), the composition of HfSiO may be selected from the range of $Hf_{0.3}Si_{0.7}O_2$ to $Hf_{0.95}Si_{0.05}O_2$. Namely, as long as the composition of HfSiO is confined within this range, it is possible to sufficiently reduce the equivalent oxide thickness without inviting the crystallization of gate insulating film.

The $Hf_{0.6}Si_{0.4}O_2$ film may be replaced by a $Zr_{0.6}Si_{0.4}O_2$ film. Since Zr element and Hf element are closely resembled to each other in chemical characteristics, they are interchangeable. Even when Zr is to be employed, it is possible to select, as in the case of Hf, the composition of ZrSiO may be selected from the range of $Zr_{0.3}Si_{0.7}O_2$ to $Zr_{0.95}Si_{0.05}O_2$. Because of little possibility of generating the phenomenon of short-circuit of gate insulating film, the employment of Hf is more preferable. When a silicon substrate is to be employed, Hf is usually selected for use. Because of high relative dielectric constant and low cost, Zr is preferable.

Then, the $Hf_{0.6}Si_{0.4}O_2$ film obtained is subjected to a nitriding treatment to create an HfSiON film. This nitriding treatment can be performed by exposing the oxide film to plasma in a nitrogen gas atmosphere. The nitriding treatment of the oxide film may be performed by treating the oxide film with ammonia. In this case, it is possible to employ aqueous ammonia or ammonia vapor. If required, the annealing of the oxide film or the treatment of the oxide film in an oxygen atmosphere may be performed before or after the aforementioned nitriding treatment.

This nitriding treatment can be applied to any composition falling within the range of $Hf_{0.3}Si_{0.7}O_2$ to $Hf_{0.95}Si_{0.05}O_2$ or falling within the range of $Zr_{0.3}Si_{0.7}O_2$ to $Zr_{0.95}Si_{0.05}O_2$.

The HfSiON film can be formed by sputtering method. For example, the HfSiON film can be directly formed in an atmosphere comprising an inert gas, oxygen and nitrogen using a Hf target and a Si target and by a chemical conversion co-sputtering method. Alternatively, the HfSiON film can be directly formed in an inert gas atmosphere using a HfSiON target.

The SiON film can be formed by forming, at first, an $Si_3N_4$ film having a thickness of about 1.5 nm on a monocrystalline Si substrate for example and then subjecting the $Si_3N_4$ film to oxidation treatment. Incidentally, the monocrystalline Si substrate is treated in advance with dilute hydrofluoric acid to remove the natural oxide film formed thereon. The oxidation treatment can be accomplished by exposing the $Si_3N_4$ film to an atmosphere of plasma or to ozone. Alternatively, the $Si_3N_4$ film may be subjected to a heat treatment at a high temperature of 600° C. or more in an atmosphere containing oxygen.

The SiON film thus obtained is again subject to a nitriding treatment. This nitriding treatment may be performed according to the same method as described above. If required, the SiON film may be subjected to annealing before or after the nitriding treatment.

A first layer 12 containing a first p-type impurity is formed on the gate insulating film 13. For example, an amorphous silicon containing indium at a density of $1 \times 10^{21}/cm^3$ or more as the first p-type impurity is deposited to a thickness of about 5 nm on the gate insulating film 13 by sputtering method. In this case, instead of the amorphous silicon, polycrystalline or amorphous silicon may be deposited to the same thickness as described above. For forming the first layer 12, it is possible to employ a silicon target containing indium at a density of $1 \times 10^{21}/cm^3$ or more. Alternatively, co-sputtering may be performed using a Si target and a target having a composition of $Si_{1-x}In_x$ ($0<x<1$). In this co-sputtering, it is possible to employ an In target and a target having a composition of $Si_{1-x}In_x$ ($0<x<1$).

Additionally, it is also possible to employ the following methods. Namely, it is possible to employ a method of burying a In pin in a Si target, a method of placing a pellet containing In on Si target, or a method of using a target comprising a Si component and an In component which are bonded together.

Because of low in concentration of impurity, Si moiety of those targets is preferable to be monocrystalline.

The indium in this case is scarcely activated, so that the indium having a higher concentration than that required of activated indium is described as one example. Incidentally, the expression of "activated" set forth in this specification means that indium is positioned at a site substituting for Si in the Si lattice. The activated impurity can be confirmed by measuring the electric conductivity for instance.

Further, it is also possible to measure an activated impurity by EXAFS (Extended X-ray Absorption Fine Structure). This method is a technique to investigate the site at which In atom is positioned in the Si lattice, wherein the relationship between the X-ray absorption coefficient at a wavelength in the vicinity of X-ray absorption edge of In atom and the X-ray wavelength is measured. The result thus obtained is, in primary approximation, a value that can be obtained through the Fourier transform of the distance of atom existing around the indium atom. Therefore, it is possible to determine the number of atoms coordinating to indium atom or the distance between the indium atom and an atom existing close to the indium atom. Namely, it is possible to determine whether or not the indium atom is positioned at the site that enables the indium atom to substitute for the silicon atom of silicon crystal.

As for the first p-type impurity, it is possible to use, for example, Al, Ga, etc. When the slowness of diffusion in the gate electrode is taken into consideration, In is most preferable as the first p-type impurity. Irrespective of the kinds of impurity, the concentration of the p-type impurity after the activation thereof should preferably be within the range of $5 \times 10^{19}/cm^3$ to $5 \times 10^{20}/cm^3$. As long as it is possible to make the concentration of the p-type impurity of $5 \times 10^{19}/cm^3$ or more, carrier can be sufficiently generated in the gate electrode, thus making it possible to secure excellent transistor properties. As long as the concentration of the p-type impurity is confined to $5 \times 10^{20}/cm^3$ or less, it is possible to retain the crystal structure of silicon.

The thickness of the first layer 12 should preferably be within the range of 0.5 to 150 nm. As long as the thickness of the first layer 12 is 0.5 nm or more, the concentration of the first p-type impurity positioned to substitute for silicon atom can be made higher than the concentration of the second p-type impurity. Namely, the concentration of the second p-type impurity should preferably be lower than the concentration of the first p-type impurity. On the other hand, as long as the thickness of the first layer 12 is 150 nm or less, a covalent bond can be easily formed the first p-type impurity and the second p-type impurity.

The first layer 12 can be formed by CVD method. In this case, a mixed gas comprising, for example, indium hexafluoroacryl acetate (In(hfrac)$_3$) and tetraethoxy silane (TEOS) may be employed. The first layer 12 may be formed by coating a liquid raw material containing silicon and indium and then by drying and sintering the coated layer.

Thereafter, the activation of the first p-type impurity in the first layer 12 is performed (first heat treatment). The activation of the first p-type impurity can be achieved by subjecting the first p-type impurity to, for example, laser annealing under predetermined conditions. Specifically, pulse laser, for example, is irradiated onto the first layer 12 thus obtained at an energy density of 1.5 J/cm$^2$ or more for 15 nsec or less, thus performing the laser annealing.

The wavelength of laser should preferably be within the range that enables the laser to be sufficiently absorbed by silicon, that is a wavelength higher than a band gap inherent to silicon. For example, it is possible to employ a laser source of excimer laser having a wavelength of ultraviolet region. The laser should preferably be irradiated obliquely to the surface of the substrate. A strip-like region of the surface of the substrate which is irradiated with the laser beam will be successively activated. The laser beam to be employed may be either continuous oscillation or pulse-like oscillation. As for the output of the laser, it is required to employ Class 4 of JIS Classification. It is desirable to co-use a guide laser of visible region.

By this treatment, it is possible to sufficiently activate the first p-type impurity in the first layer 12, thereby lowering the electric conductivity of the gate electrode to be formed in a subsequent step. Especially, when In is employed as the first p-type impurity, it is possible to enhance the solid solution limit thereof up to about $2\times10^{20}$/cm$^3$.

If the energy density of pulse laser is less than 1.5 J/cm$^2$, the activation of indium employed as the first p-type impurity would become insufficient. Furthermore, the indium cannot be bonded to Si atoms located around the indium through a four-coordinate covalent bond having 3 to 4 bonding hands, so that it is impossible to obtain an arrangement where Si atom can be substituted. On the other hand, when the irradiating (heating) time exceeds 15 nsec, the diffusion of first p-type impurity may become excessive or the structure of various regions would be damaged.

The activation of the first p-type impurity may be also performed by flash lamp annealing. For example, a heat treatment for 1 msec or less at a temperature exceeding 1100° C. is performed.

In this flash lamp annealing, it is preferable to secure the uniformity of in-plane temperature of substrate. Especially, it is important to secure the uniformity of in-plane temperature of substrate in every moment during the irradiation which may be performed at intervals of about 10 nsec. The in-plane distribution of temperature should preferably be 50° C. or less preferably 10° C. or less.

If the heating time exceeds 1 msec, the diffusion of the first p-type impurity may become excessive to give damage to the structure of various regions.

On the first layer 12 after heat-treated, a silicon film having a thickness of 120 nm is formed by CVD method for instance. This silicon film may be either amorphous silicon or polycrystalline silicon. Further, the thickness of the silicon film may range from 0.5 to 300 nm. More specifically, the silicon film is deposited in such a manner that a total thickness of the first layer 12 and the silicon film to be deposited on the first layer 12 becomes identical with the thickness of the next film. This total thickness corresponds to the film thickness of gate electrode formed of polycrystalline silicon employed in the ordinary process of forming an integrated circuit. The film thickness of this gate electrode is typically 300 nm or less, for example about 150 nm.

Into this silicon film, the second p-type impurity is injected by ion implantation method using boron or boron trifluoride. For example, boron atom is injected into the silicon film at a concentration of about $2\times10^{20}$/cm$^3$ which is required for the activation thereof, thus obtaining a second layer 11. In this manner, the structure as shown in FIG. 1 can be obtained.

This second p-type impurity is required to have a smaller atomic radius than that of the aforementioned first p-type impurity. The reason for this is that, in the conventional LSI process, the electric properties of p-type impurity having a smaller atomic radius tend to become more preferable than those of p-type impurity having a larger atomic radius. In other words, the second p-type impurity is smaller in radius of covalent bond than that of the first p-type impurity.

As long as this condition is met, it is possible to select any kind of the second p-type impurity depending on the kind of the first p-type impurity and to optionally use it in combination with the first p-type impurity. For example, it is possible to combine Ge as the first p-type impurity with B as the second p-type impurity. Because of the reasons that the p-type impurity is not readily diffusible and moreover has preferable electric properties, it is most preferable to employ In as the first p-type impurity and employ B as the second p-type impurity.

By bonding the first p-type impurity to the second p-type impurity through covalent bond, it becomes possible to retain electric activities while suppressing the diffusion thereof. Due to the fact that the atomic radius of the second p-type impurity is smaller, it is possible to suppress the diffusion of the first p-type impurity and to enhance the electric properties thereof. Irrespective of the kinds of impurities, the concentration of the second p-type impurity should preferably be within the range of $5\times10^{19}$/cm$^3$ to $5\times10^{20}$/cm$^3$. If the concentration of the second p-type impurity is less than $5\times10^{19}$/cm$^3$, the operation of transistor may become more difficult due to an insufficient quantity of activated carrier. On the other hand, if the concentration of the second p-type impurity exceeds $5\times10^{20}$/cm$^3$, the second p-type impurity having no covalent bond with the first p-type impurity exists even in a region where the concentration of the first p-type impurity is made higher, thereby possibly preventing the first p-type impurity from exhibiting its effect.

The subsequent steps to be followed thereafter may be the same as conventionally employed in the manufacture of conventional logic circuit.

Figure 2:
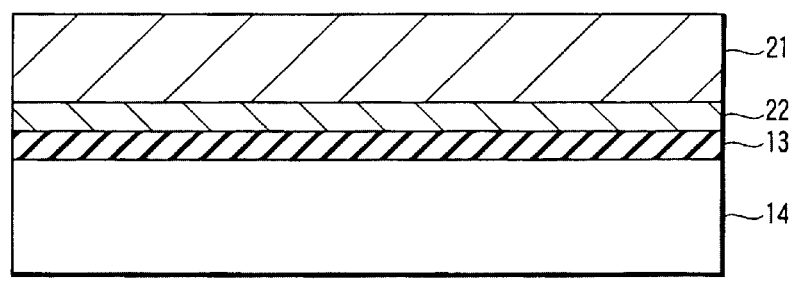
FIG. 2 is a cross-sectional view illustrating a manufacturing step to be performed next to the step of FIG. 1.
Figure 3:
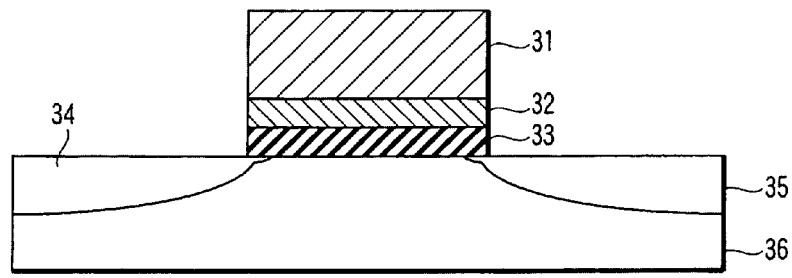
FIG. 3 is a cross-sectional view illustrating a manufacturing step to be performed next to the step of FIG. 2.

Namely, the second layer 21, the first layer 22 and the gate insulating layer 13 shown in FIG. 2 are worked according to the conventional methods to form a gate structure shown in FIG. 3. The gate electrode is constituted by the first layer 32 thus worked and the second layer 31 thus worked. Thereafter, an impurity such as boron is introduced into the substrate 36 by ion implantation to create a source region 34 and a drain region 35.

After the source region 34 and the drain region 35 are created in this manner, the substrate is heat-treated at a temperature ranging from 800° C. to 1100° C. For example, the substrate is heat-treated at a temperature of 1000° C. for about 30 sec to perform the thermal activation thereof (the second heat treatment). By this thermal activation, the boron in the gate electrode as well as the boron in the source region and the drain region can be activated.

If the temperature of this heat treatment is lower than 800° C., the activation may become insufficient and hence the quantity of carrier may become insufficient, thus making it difficult to satisfactorily operate the transistor. On the other hand, if the temperature of this heat treatment exceeds 1000° C., the diffusion of p-type impurity may become excessive or various problems such as damages to the structure of various regions may generate. The heat treatment time ordinarily ranges from 30 min to 5 sec or so, the actual heat treatment time being suitably determined depending on the temperature of heat treatment, etc.

The heat treatment on this occasion should preferably be performed under the conditions falling within the range represented by the following formula as the heat treatment temperature is defined as $T(° C.)$ and the partial pressure of oxygen in the atmosphere is defined to $P$ (Pa). This condition is estimated from the document by J. V. Seiple and J. P. Pelz.

$$\mathrm{Log}(10)P \leq -20 \times 1000 \div (T+273.15)+12.5$$

If the heat treatment is performed under a partial pressure (P) of oxygen which is higher than that of the aforementioned condition, an oxide film may be formed on the gate electrode. In order to remove this oxide film, it is required to undertake a process for protecting other structures. Since the oxide film can be removed by dilute hydrofluoric acid treatment, the condition for the atmosphere of heat treatment can be alleviated. The condition can be formulated so as to make the partial pressure of oxygen 0.1 Pa or less.

As a result of the second heat treatment, a bond represented by the following chemical formula (1) generates in the first layer 21 and between the first p-type impurity (indium) positioned at a site substituting silicon atom and the second p-type impurity (boron) positioned at a site substituting silicon atom. In this manner, it is possible to obtain the first layer 22 that has been heat-treated.

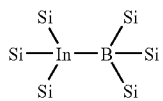
(1)

In this case, the indium atom and the boron atom are not necessarily positioned exactly at a site where silicon atom is originally located. Namely, a structure is created which reflects the fact that the atomic radius of covalent bond of indium atom is far larger than the atomic radius of covalent bond of boron atom.

The bond described above may not necessarily be existed uniformly in the first layer 22 that has been heat-treated, but may be existed with a gradient in thickness-wise.

The boron atom is enabled to bond with Si atoms located therearound through a four-coordinate covalent bond having 3 to 4 bonding hands. On this occasion, the boron atom diffuses into the silicon film containing indium, thus forming a four-coordinate covalent bond between the indium atom and the boron atom. Moreover, a four-coordinate covalent bond is also formed between the indium atom and the silicon atoms existing around the indium atom and, at the same time, a four-coordinate covalent bond is also formed between the boron atom and the silicon atoms existing around the boron atom, thus keeping these regions stable. This phenomenon has been confirmed through the primary principle calculation.

Specifically, the detailed primary principle calculation using the generalized gradient approximation was preformed by applying a pseudo-potential method to the density functional formalism. In the local density approximation (LDA) of density functional formalism, the following phenomenon has been known. Namely, in the case of the atom having 4d closed shell such as indium, the scattering d-orbit becomes narrower than the actual value that can be obtained through the experiments, thus causing the energy level to shift upward.

Herein, the aforementioned problem was corrected using partial core correction (PCC) and the technique of ultrasoft quasi-potential. PBE96 which is a kind of the generalized gradient approximation (GGA) was employed as an exchange interaction, and a conjugate gradient method was employed for both of the diagonalization of the state of electron and the optimization of the position of atom. As long as the processing time is limited to such that is required for the thermal activation treatment, there is little possibility of generating the re-inactivation of indium.

Incidentally, in the conventional typical process of forming an integrated circuit, the gate electrode is formed using polycrystalline silicon or amorphous silicon. In this gate electrode, the state of bonding between the indium atom and the boron atom on the gate insulating film side can be represented by the following chemical formulas (2) and (3).

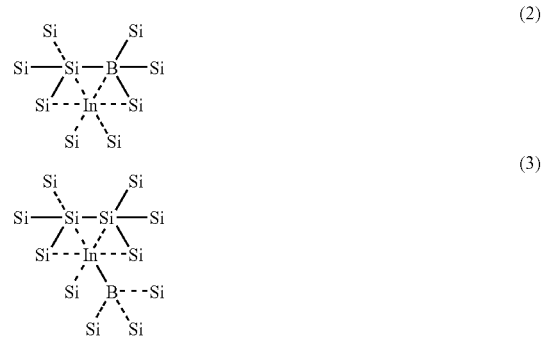

In the chemical formula (2), although the indium atom is located close to the boron atom, the indium atom is not positioned at a site substituting silicon atom. Further, the bond between the boron atom and the silicon atom is not that of four-coordinate. In the chemical formula (3), although only the bond between the indium atom and the boron atom is effected through a four-coordinate covalent bond, the bond between the indium atom or the boron atom and the silicon atoms located around them is not that of four-coordinate. Furthermore, the state where a pair of boron atom and indium atom is positioned at a site substituting silicon atom is not preferable.

As described above, according to the conventional structure, the bonding state between the indium atom and the boron atom is limited to such that it may not be constituted by a covalent bond or, if it is constituted by a covalent bond, the covalent bond is not of four-coordinate.

In view of the conclusion obtained from the primary principle calculation and in view of the comparison with the conventional bonding state, the bonding state between atoms for enabling the first p-type impurity to be captured by the second p-type impurity can be analyzed as follows. Namely, under the condition where the element of the first p-type impurity in the gate electrode is existed forming a four-coordinate covalent bond with the second p-type impurity and with the Si elements existing around the element of the first p-type impurity, the energy thereof would be lower than that of the state to be discussed as follows. For example, it may be the state wherein the elements of the first p-type impurity in the gate electrode or the elements of the second p-type impurity in the gate electrode are not located close to the Si atom but are all coordinated to the surrounding Si atom to form a four-coordinate covalent bond. Alternatively, it may be the state wherein the elements of the first p-type impurity in the gate electrode or the elements of the second p-type impurity in the gate electrode are existed at an interstitial site.

Because of this, only the depletion layer of 0.5 nm or less generates at an electric field of 5 MV/cm in the first layer 22 after the heat treatment. This fact has been confirmed from the result of the primary principle calculation. Namely, in the gate electrode that has been manufactured according to the method of this embodiment of the present invention, the indium atom and the boron atom are respectively positioned at a site substituting one silicon atom. These indium atom and boron atom are respectively existed taking a state of four-coordinate bond with the surrounding silicon atoms. Further, the indium atom and the boron atom are kept in a state of four-coordinate covalent bond with each other. It has been calculated, under these conditions, that holes can be fed to the surrounding silicon crystal to secure the electric activity thereof. As a result, it is possible to suppress the thickness of the depletion layer to be generated to 0.5 nm or less, which is advantageous in reducing the $SiO_2$ equivalent film thickness.

Additionally, it is possible to obtain the following advantages. Generally speaking, the silicon containing only boron is smaller in crystal lattice constant as compared with that of pure silicon. When both boron and indium are incorporated into silicon, the crystal lattice constant thereof would become almost the same as that of pure silicon, thus making it possible to expect the enhancement in activation of impurity atoms.

It is possible, through the employment of the method of this example, to prevent the effective film thickness of the gate insulating film from increasing. Moreover, it is possible to suppress the generation of electric defects in the gate insulating film or the shifting of flat band voltage, which may occur due to the diffusion of boron existing in the electrode into the gate insulating film.

The subsequent steps to be followed thereafter may be the same as conventionally employed in the manufacture of conventional logic circuit.

In the semiconductor device to be manufactured according to this example, the first p-type impurity and the second p-type impurity are enabled to exist in a predetermined state of bonding in the gate electrode. Because of this, it is possible to achieve the thinning of the gate insulating film.

EXAMPLE 2

By repeating the same procedure as described in the aforementioned Example 1, a gate insulating film 13 is formed on a monocrystalline Si substrate 14.

An SiGe film containing a first p-type impurity and having a thickness of about 5 nm is formed on the gate insulating film 13 thus obtained, thereby forming a first layer 12. As for the SiGe film to be formed in this case is $Si_{1-x}Ge_x$ (0<x<0.25). Because of the same reason, In is preferable as a first p-type impurity. The concentration thereof may be set somewhat larger so as to make the concentration of indium become $5\times10^{19}/cm^3$ or more after the activation thereof to be performed in a subsequent step. The upper limit in concentration of indium after the activation thereof to be performed in a subsequent step should preferably be set to about $5\times10^{20}/cm^3$. Further, it is also possible to employ other kinds of impurities such as Al and Ga as the first p-type impurity.

When forming the first layer 12, it is possible to employ an SiGe target containing indium at a density of $2\times10^{21}/cm^3$ or more. Alternatively, co-sputtering may be performed using a Si target, a Ge target and an In target. In this co-sputtering, it is possible to employ a Ge target and a target having a composition of $Si_{1-x}In_x$ (0<x<1). Alternatively, an In target, a Ge target and a target having a composition of $Si_{1-x}In_x$ (0<x<1) may be employed.

Additionally, it is also possible to employ the following methods. Namely, it is possible to employ a co-sputtering method wherein a Si target having an In pin buried therein and a Ge target are employed, a method of co-sputtering wherein a Si target having an In-containing pellet placed thereon and a Ge target are employed, or a sputtering method wherein a target comprising a Si component and an In component which are bonded together is employed.

The first layer 12 can be also formed by CVD method using a mixed gas comprising a silicon raw material and a germanium raw material. The first layer 12 can be also formed by coating a liquid raw material containing silicon, germanium and indium and then by drying and sintering the coated layer.

Thereafter, the first layer 12 thus obtained is subjected to heat treatment (first heat treatment) in the same manner as employed in Example 1 to activate the indium employed as the first p-type impurity.

On this first layer 12 after heat-treated, a second layer 11 containing a second p-type impurity is deposited in the same manner as employed in Example 1. As for the kinds and concentration of the second p-type impurity that can be employed as well as the thickness of the second layer 11, they may be the same as employed in Example 1.

The subsequent steps to be followed thereafter may be the same as conventionally employed in the manufacture of conventional logic circuit.

Namely, the second layer 21, the first layer 22 and the gate insulating layer 13 are worked according to the conventional methods to form a gate structure shown in FIG. 3. The gate electrode is constituted by the first layer 32 thus worked and the second layer 31 thus worked. Thereafter, an impurity such as boron is introduced into the substrate 36 by ion implantation to create a source region 34 and a drain region 35.

The first layer 32, the source region 34 and the drain region 35 thus worked are then subjected to a heat treatment (the second heat treatment) under the same conditions as described in Example 1. As a result of this second heat treatment, a bond represented by the aforementioned chemical formula (1) generate in the first layer 21 and between the first p-type impurity (indium) and the second p-type impurity (boron). Additionally, boron diffuses into the first layer 12 consisting of an SiGe film containing indium, thereby generating the bond represented by the following chemical formula (4).

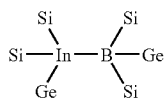
(4)

In this manner, it is possible to obtain the first layer 22 that has been heat-treated. As in the case of Example 1, the bond represented by the chemical formula (4) may not necessarily be existed uniformly in the first layer 22 that has been heat-treated, but may be existed with a gradient in thickness-wise.

In this manner, a four-coordinate covalent bond is formed between the indium atom and the boron atom. A four-coordinate covalent bond is also formed between the surrounding silicon atoms or the germanium atom and the indium atom. Furthermore, a four-coordinate covalent bond is also formed between the surrounding silicon atoms or the germanium atom and the boron atom. Under these conditions, the atoms are kept in a stable state. As explained above, this phenomenon can be understood from the primary principle calculation.

Incidentally, in the gate electrode that can be formed by using SiGe according to the conventional typical process of forming an integrated circuit, the state of bonding between the indium atom and the boron atom on the gate insulating film side can be represented by the following chemical formulas (5) and (6). The chemical formulas (5) and (6) are fundamentally the same with the chemical formulas (2) and (3) except that some of Si atoms constituting the construction of the gate electrode are replaced by Ge atoms, which in turn correspond to a construction of gate electrode whose base material is altered from silicon to SiGe. Therefore, the state of bond, etc. are the same as those of the chemical formulas (2) and (3) of Example 1.

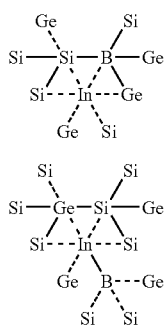

(5)

(6)

As described above, according to the conventional structure, the bonding state of the indium atom is limited to such that it may not be constituted by a covalent bond or, if it is constituted by a covalent bond, the covalent bond is not of four-coordinate. As already explained above, due to the difference in the bonding state, it is possible to prevent the effective film thickness of the gate insulating film from increasing. Moreover, it is possible to suppress the generation of electric defects in the gate insulating film or the shifting of flat band voltage, which may occur due to the diffusion of boron existing in the electrode into the gate insulating film.

The subsequent steps to be followed thereafter may be the same as in the case of Example 1.

In the semiconductor device to be manufactured according to this example, the first p-type impurity and the second p-type impurity exist in a predetermined state of bonding in the gate electrode. Because of this, it is possible to achieve the thinning of the gate insulating film.

Incidentally, it is possible to form, as the first layer 12, an $Si_{1-x}Ge_x$ ($0.25 \leq x \leq 0.35$) film containing indium at a concentration of $1 \times 10^{20}/cm^3$ as the activated first p-type impurity. In this case, the heat treatment for activating the indium after the formation of the first layer 12 may not necessarily be required.

In the case of the $Si_{1-x}Ge_x$ ($0.25 \leq x \leq 0.35$) film containing indium, the conditions for heat treatment required for the activation of the indium can be alleviated as compared with the activating conditions of a silicon film containing indium. For example, the heat treatment can be satisfactorily performed at a temperature of 1000° C. taking 30 sec or so. The reason for this can be mainly ascribed to the fact that, as inferred from the difference in melting point between silicon and germanium, as the quantity of germanium is increased, the conditions for heat treatment which are required for the activation can be proportionally alleviated. Because of this reason, in the case of the $Si_{1-x}Ge_x$ ($0.25 \leq x \leq 0.35$) film containing indium, the conditions for activating this film can be made substantially the same as the activating conditions of the silicon film containing boron.

Therefore, it is possible to reduce the depletion layer by heat-treating the second layer 11 consisting of a silicon film containing boron. It is possible, by this heat treatment, to collectively activate both of the first layer 12 consisting of an $Si_{1-x}Ge_x$ ($0.25 \leq x \leq 0.35$) film containing indium and the second layer 11 consisting of a silicon film containing boron.

EXAMPLE 3

This example will be explained with reference to FIGS. 4 and 5.

By following the same procedure as described in Example 1, a gate insulating film 13 and a first layer 12 are successively deposited on a substrate 14. Then, the first layer 12 is subjected to a heat treatment (first heat treatment) in the same manner as employed in Example 1, thereby activating the indium employed as the first p-type impurity.

It is possible, in place of the silicon film containing indium, to employ an $Si_{1-x}Ge_x$ ($0<x<0.25$) film containing indium as the first layer 12. In this case also, the indium employed as the first p-type impurity is activated in the same manner as described in the above-described Example 1 or 2 with reference to the $Si_{1-x}Ge_x$ ($0<x<0.25$) film.

Alternatively, an $Si_{1-x}Ge_x$ ($0.25 \leq x \leq 0.35$) film containing indium can be used as the first p-type impurity. In this case, as described in Example 2, it is not required, at this moment, to perform any special heat treatment for activating the indium.

On this first layer 12 is deposited a layer 61 consisting of a metal boride by sputtering for instance. As for the metal boride, it can be selected from the group consisting of HfB, $HfB_2$, TaB, $TaB_2$, WB, $W_2B$, $W_2B_5$, ReB, $Re_7B_3$, $LnB_6$ (Ln is lanthanoid element), $LnB_4$ (Ln is lanthanoid element), $LnB_2$ (Ln is lanthanoid element), $ZrB$, $ZrB_2$, NbB, $NbB_2$, MoB, $MO_2B$, $MO_2B_6$, $MO_7B_3$, $MO_6B$, $YB_6$, $YB_4$, $YB_2$, TiB, $TiB_2$, VB, $VB_2$, CrB, $Cr_2B$, $Cr_7B_3$, $Cr_6B$, MnB, FeB, $Fe_2B$, CoB, NiB, $Ni_3B$, and $Ni_6B$. Although it is most practical to perform the sputtering using a target having the aforementioned compositions, it is also possible to employ a method using chemical conversion sputtering. The metal boride layer may be formed by CVD method or liquid-coating method.

Figure 4:
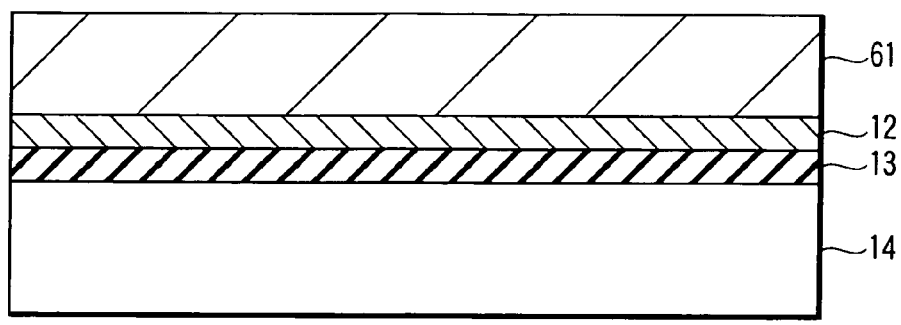
FIG. 4 is a cross-sectional view illustrating one step in the method of manufacturing a semiconductor device according to another embodiment of the present invention.

In this manner, the structure as shown in FIG. 4 can be obtained. TiN may be deposited as a barrier layer on the metal boride layer 61 or tungsten may be deposited as a plug on the metal boride layer 61. The subsequent steps to be followed thereafter may be the same as conventionally employed in the manufacture of conventional logic circuit.

After forming the metal boride layer 61, the resultant body is subjected to heat treatment (the second heat treatment) under the same conditions as employed in Example 1. For example, this body is heat-treated at a temperature of 800° C. for about 30 sec. As long as the heat treatment time is limited to this duration of time, there is little possibility of generating the re-inactivation of indium. As a result of this heat treatment, the boron in the metal boride layer 61 diffuse into the first layer 12 to form a four-coordinate covalent bond between the indium atom and the boron atom. Furthermore, a four-coordinate covalent bond is also formed between the surrounding silicon atoms and the indium atom, and between the surrounding silicon atoms and the boron atom, thus stabilizing the these atoms. As explained above, this phenomenon can be understood from the primary principle calculation.

Figure 5:
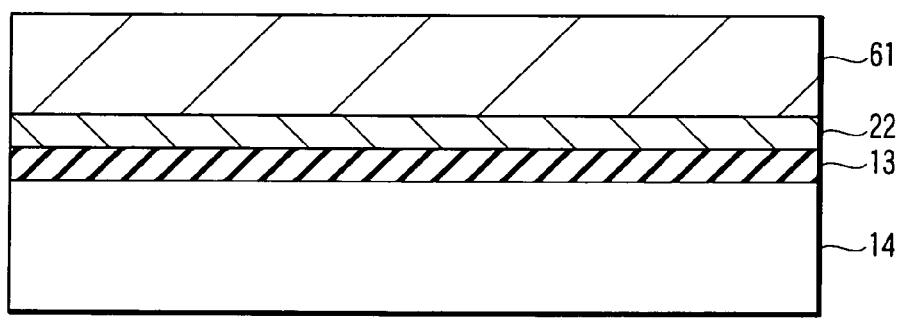
FIG. 5 is a cross-sectional view illustrating a manufacturing step to be performed next to the step of FIG. 4.

Namely, the bond represented by the aforementioned chemical formula (1) is generated, thus obtaining the first layer 22 that has been heat-treated as shown in FIG. 5. Due to the bond represented by the aforementioned chemical formula (1), it is possible, in this example, to prevent the effective film thickness of the gate insulating film from increasing. Moreover, it is possible to suppress the generation of electric defects in the gate insulating film or the shifting of flat band voltage, which may occur due to the diffusion of boron existing in the electrode into the gate insulating film.

Moreover, it is possible to activate the source-drain region which is main object of this heat treatment. In the conventional process for manufacturing a logic circuit, the heat treatment is essential, the gate stack structure that has been heat-treated is required to exist stable. Thus, the metal boride having a high melting point is necessary, as described above.

In the semiconductor device that can be manufactured in this example, since the first p-type impurity and the second p-type impurity are enabled to exist in a predetermined bonded state in the gate electrode, it is now possible to achieve the reduction in thickness of the gate insulating film.

EXAMPLE 4

By following the same procedure as described in Example 1, a gate insulating film 13 and a first layer 12 are successively deposited on a monocrystalline Si substrate 14. Prior to the activation of the first p-type impurity included in the first layer 12, the second layer 11 is formed on the first layer 12 by following the same procedure as described in Example 1.

After the gate insulating film 13, the first layer 12 and the second layer 11 have been worked according to the conventional method, an impurity such as boron is introduced into the substrate 36 by ion implantation, etc. to form a source region 34 and a drain region 35. Thereafter, by following the same procedure as described in Example 1, laser annealing or flash lamp annealing was performed to activate the first p-type impurity existing in the first layer 12.

Due to the laser annealing or the flash lamp annealing, the source region as well as the drain region are concurrently activated. Therefore, the heat treatment of these regions at a temperature ranging from 800° C. to 1100° C. may not necessarily be required.

As in the case of Example 1, the subsequent steps to be followed thereafter may be the same as conventionally employed in the manufacture of conventional logic circuit.

EXAMPLE 5

By following the same procedure as described in Example 1, a gate insulating film 13 is formed on a monocrystalline Si substrate 14. Then, a first p-type impurity is deposited on the gate insulating film 13 by sputtering method to form a layer having a thickness ranging from 0.5 to 1.5 atomic layer. For example, when the first p-type impurity to be included in the first layer 12 is indium, an In layer is deposited as an In-rich layer before forming this first layer 12.

By following the same procedure as described in Example 1, the first layer 12 containing a first impurity is formed on the In layer. The subsequent steps to be followed thereafter are performed in the same manner as in Example 1. Alternatively, the same procedure as described in Example 4 may be adopted after the step of forming the In layer.

According to the method of this example, the In layer that has been formed below the first layer 12 can be vanished by the effect of the laser annealing or the flash lamp annealing and can be integrated into the first layer 12. As a result, it is possible to provide the concentration of indium with a gradient in thickness-wise in the first layer 12. More specifically, the concentration of indium on the gate insulating film 13 side can be sharply increased up to as high as 20% or so. Because of this, the diffusion of boron employed as the second p-type impurity can be reliably suppressed.

Further, since the boron that has been diffused near to the gate insulating film 13 due to the heat treatment can be captured at this region, a metallic substance may generate. For example, examples of such a metallic substance include indium/boron and indium/silicon/boron. As a result, it is possible to suppress the depletion of the gate electrode. Even if gallium or aluminum is employed substituting for the indium, it is possible to expect almost the same effects.

EXAMPLE 6

By following the same procedure as described in Example 1, a gate insulating film 13 is formed on a monocrystalline Si substrate 14. Then, a boride as a first p-type impurity is deposited on the gate insulating film 13 by sputtering method to form a layer having a thickness ranging from 0.5 to 1.5 atomic layer. For example, when the first p-type impurity to be included in the first layer 12 is indium, an InB layer is deposited as an In-rich layer prior to the formation of this first layer 12.

It is well known that, irrespective of the composition, indium/boron is incapable of forming a compound or a solid solution. In the case of a very thin film of as thin as 0.5 to 1.5 atomic layer, the nature thereof is not necessarily identical with the bulk thereof and a film consisting of indium/boron is formed. It is also possible to employ gallium/boron or aluminum/boron in place of indium/boron.

After depositing the InB layer, the InB layer is subjected to the same steps as employed in the aforementioned Example 5. Due to the InB layer, a peak in concentration of indium will be generated at the interface between the first layer 12 and the gate insulating film 13, and at the same time, a peak in concentration of boron will be generated in the vicinity of the peak of the concentration of indium. As a result, it is possible to effectively suppress the depletion of the gate electrode in the vicinity of the gate insulating film 13. Namely, it is possible to suppress any increase in apparent thickness of the gate electrode due to the generation of depletion.

EXAMPLE 7

By following the same procedure as described in Example 1, a gate insulating film 13 is formed on a monocrystalline Si substrate 14. Then, indium is deposited on the gate insulating film 13 by sputtering method to form, as an In-rich layer, an indium layer having a thickness ranging from 0.5 to 1.5 atomic layer. On this In layer is deposited boron by sputtering method to form a boron layer having a thickness ranging from 0.5 to 1.5 atomic layer.

The steps to be followed after the formation of the B layer may be the same as those of Example 6. By performing laser annealing or flash lamp annealing in the same manner as employed in Example 1, the In layer, the B layer and the first layer containing the first p-type impurity are solid-solubilized to each other, whereby they are substantially integrated.

According to the method of this example, a peak in concentration of indium will be generated at the interface between the first layer 12 and the gate insulating film 13, and at the same time, a peak in concentration of boron will be generated in the vicinity of the peak of the concentration of indium. However, the construction of this example differs from the construction of aforementioned Example 6 in that the peak in concentration of boron is created at a region which is more far away from the gate insulating film than the peak in concentration of indium. Therefore, it is possible to expect, in addition to the effects shown in Example 6, the effect of minimizing the quantity of boron diffusing into the gate insulating film.

In this example, it is also possible to employ an InB layer in place of the In layer. It is possible, in this case also, to realize the structure wherein the peak in concentration of boron is created at a region which is more far away from the gate insulating film than the peak in concentration of indium.

EXAMPLE 8

By following the same procedure as described in Example 1, a gate insulating film 13 is formed on a monocrystalline Si substrate 14. Then, a first layer 12 is formed on the gate insulating film 13 by sputtering method using a monocrystalline silicon target containing indium atom at a concentration of $1\times10^{21}/cm^3$. In this case, the sputtering atmosphere may be an argon gas atmosphere or an argon gas atmosphere containing hydrogen.

When the first layer 12 is formed under these conditions, the first layer can be made amorphous containing indium. Since the indium atom is uniformly distributed throughout the silicon film, the precipitation of indium at the grain boundaries of silicon crystal can be substantially avoided even if the first layer is annealed. As the site of silicon atom is substituted by indium atom in the silicon crystal, the ratio of activation can be enhanced. As for the steps other than the step of forming the first layer containing a first p-type impurity, i.e. indium in this example, it is possible to adopt the same procedures as employed in the forgoing Examples 1 to 7.

According to the present invention, it is possible to provide a method of manufacturing a semiconductor device wherein the reduction in $SiO_2$ equivalent film thickness of the gate insulating film can be achieved.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A method for manufacturing a semiconductor device comprising:
    forming a gate insulating film on a semiconductor substrate;
    forming an In-rich layer having a thickness ranging from 0.5 to 1.5 atomic layer through the deposition of In or InB on the gate insulating film;
    forming a first layer on the In-rich layer, the first layer containing an amorphous or polycrystalline formed of $Si_{1-x}Ge_x$ ($0\leq x<0.25$) and containing In as a first p-type impurity;
    subjecting the first layer to a first heat treatment wherein the first layer is heated for 1 msec or less at a temperature higher than 1100° C. or the first layer is irradiated with laser having an energy density of 1.5 J/cm² or more for 15 nsec or less to laser-anneal the first layer, a solid solution limit of the first p-type impurity in the first layer after the first heat treatment being enhanced up to $2\times10^{20}/cm^3$;
    forming a second layer on the first layer, the second layer containing B as a second p-type impurity and formed of amorphous silicon or polycrystalline silicon, the second p-type impurity having a smaller covalent bond radius than that of the first p-type impurity; and
    subjecting the second layer to a second heat treatment to heat the second layer at a temperature ranging from 800° C. to 1100° C.

2. The method according to claim 1, wherein forming the first layer is performed by sputtering using a monocrystalline target containing In at a concentration of $1\times10^{21}/cm^3$ or more.

3. The method according to claim 1, further comprising, after forming the In-rich layer and before forming the first layer, forming a B layer having a thickness ranging from 0.5 to 1.5 atomic layer on the In-rich layer.

4. The method according to claim 1, wherein the first heat treatment is performed after forming the second layer.

5. The method according to claim 1, wherein the concentration of the second p-type impurity in the second layer is smaller than that of the first p-type impurity in the first layer.

6. The method according to claim 1, wherein a bond represented by the following chemical formula (1) is generated in the first layer by the second heat treatment, with the proviso that a part of Si may be substituted with Ge

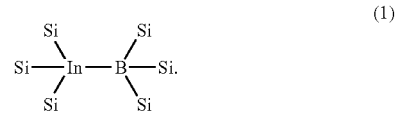

7. A method for manufacturing a semiconductor device comprising:
    forming a gate insulating film on a semiconductor substrate;
    forming an In-rich layer having a thickness ranging from 0.5 to 1.5 atomic layer through the deposition of In or InB on the gate insulating film;
    forming a B layer having a thickness ranging from 0.5 to 1.5 atomic layer on the In-rich layer;

forming a first layer on the B layer, the first layer containing In as a first p-type impurity and $Si_{1-x}Ge_x(0.25 \leq x < 0.35)$; and forming a second layer on the first layer, the second layer containing amorphous silicon or polycrystalline silicon and containing B as a second p-type impurity, the second p-type impurity having a smaller covalent bond radius than that of the first p-type impurity.

8. The method according to claim 7, wherein forming the first layer is performed by sputtering using a monocrystalline target containing In at a concentration of $1 \times 10^{21}/cm^3$ or more.

9. The method according to claim 7, wherein the concentration of the second p-type impurity in the second layer is smaller than that of the first p-type impurity in the first layer.

10. The method according to claim 7, wherein a bond represented by the following chemical formula (4) is generated in the first layer after the second layer is formed

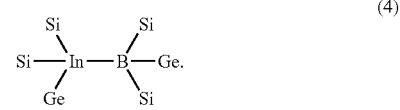

(4)